(12) United States Patent
Chen et al.

(10) Patent No.: US 7,151,391 B2
(45) Date of Patent: Dec. 19, 2006

(54) INTEGRATED CIRCUIT FOR LEVEL-SHIFTING VOLTAGE LEVELS

(75) Inventors: Ker-Min Chen, Hsinchu (TW); Kuo-Ji Chen, Wu-Ku (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 25 days.

(21) Appl. No.: 10/852,390

(22) Filed: May 24, 2004

(65) Prior Publication Data

US 2005/0258864 A1 Nov. 24, 2005

(51) Int. Cl.
*H03K 19/0175* (2006.01)

(52) U.S. Cl. .............................. 326/68; 326/81; 326/63

(58) Field of Classification Search ................ 326/68, 326/81, 63; 257/357; 327/63, 170, 333; 365/230.06

See application file for complete search history.

(56) References Cited

U.S. PATENT DOCUMENTS

| 4,978,870 | A | * | 12/1990 | Chen et al. ................. 326/68 |
| 5,289,054 | A | * | 2/1994 | Lucas ......................... 327/63 |
| 5,723,986 | A | * | 3/1998 | Nakashiro et al. .......... 326/81 |
| 6,043,699 | A | * | 3/2000 | Shimizu ..................... 327/333 |
| 6,066,971 | A | * | 5/2000 | Pappert et al. ............. 327/170 |
| 6,084,459 | A | * | 7/2000 | Jeong ......................... 327/333 |
| 6,121,091 | A | | 9/2000 | Wang |
| 6,262,598 | B1 | * | 7/2001 | Cairns et al. ............... 326/81 |
| 6,476,637 | B1 | * | 11/2002 | Brownlow et al. ......... 326/81 |
| 6,487,139 | B1 | * | 11/2002 | Pathak .................. 365/230.06 |
| 6,617,878 | B1 | * | 9/2003 | Brownlow et al. ......... 326/68 |
| 6,768,368 | B1 | * | 7/2004 | Kaneko et al. ............ 327/333 |
| 6,770,938 | B1 | * | 8/2004 | Fliesler et al. ............. 257/357 |
| 6,838,905 | B1 | * | 1/2005 | Doyle ......................... 326/81 |
| 6,853,234 | B1 | * | 2/2005 | Bucossi ..................... 327/333 |
| 6,894,537 | B1 | * | 5/2005 | Wert ........................... 326/63 |

OTHER PUBLICATIONS

K. Joe Hass and David F. Cox / Level Shifting Interfaces for Low Voltage Logic / 9th NASA Symposium on VLSI Design 2000 / NASA Institute of Advanced Microelectronics Research Center, University of New Mexico, Albuquerque, New Mexico—pp. 3.1.1-3.1.7, no date.

* cited by examiner

*Primary Examiner*—Jean Bruner Jeanglaude
(74) *Attorney, Agent, or Firm*—Haynes and Boone, LLP

(57) ABSTRACT

An integrated circuit for level-shifting voltage signals comprising an input/output pad, and an input/output circuit coupled to the output pad having a plurality of devices operating with a bias supply voltage operable to shift between the range of the bias supply voltage to the range of an input/output supply voltage that is higher than the bias supply voltage is provided. In addition, an integrated circuit comprises an input circuit coupled to an input pad operable to input shift signals from an input/output supply voltage range to a core supply voltage range, an output circuit coupled to an output pad operable to shift output signals from a bias supply voltage range to an input/output supply voltage range, and a core circuit coupled to the input and output circuits and having a gate dielectric thickness substantially similar to a gate dielectric thickness of the input circuit and the output circuit.

14 Claims, 5 Drawing Sheets

INTEGRATED CIRCUIT FOR LEVEL-SHIFTING VOLTAGE LEVELS

BACKGROUND

An integrated circuit (IC) is formed by creating one or more devices (e.g., circuit components) on a semiconductor substrate using a myriad of fabrication processes. As fabrication processes and materials improve, semiconductor device geometries have continued to decrease in size since such devices were first introduced several decades ago. For example, current fabrication processes are producing devices having feature sizes (e.g., the smallest component (or line) that may be created using the process) of less than 65 nm. However, the reduction in size of device geometries frequently introduces new challenges that need to be overcome.

As microelectronic device geometries scale down towards 20 nm, the electrical efficiency of integrated circuit design becomes an issue that impacts product performance. For example, driven by the need to reduce power consumption, the nominal operating supply voltage of these devices has been pushed lower to voltage levels around 1.0 volts or below 1.0 volts. However, common integrated devices and logic testing devices do not operate at these low voltage levels, making the interface between these low voltage devices and common integrated devices a challenging problem.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
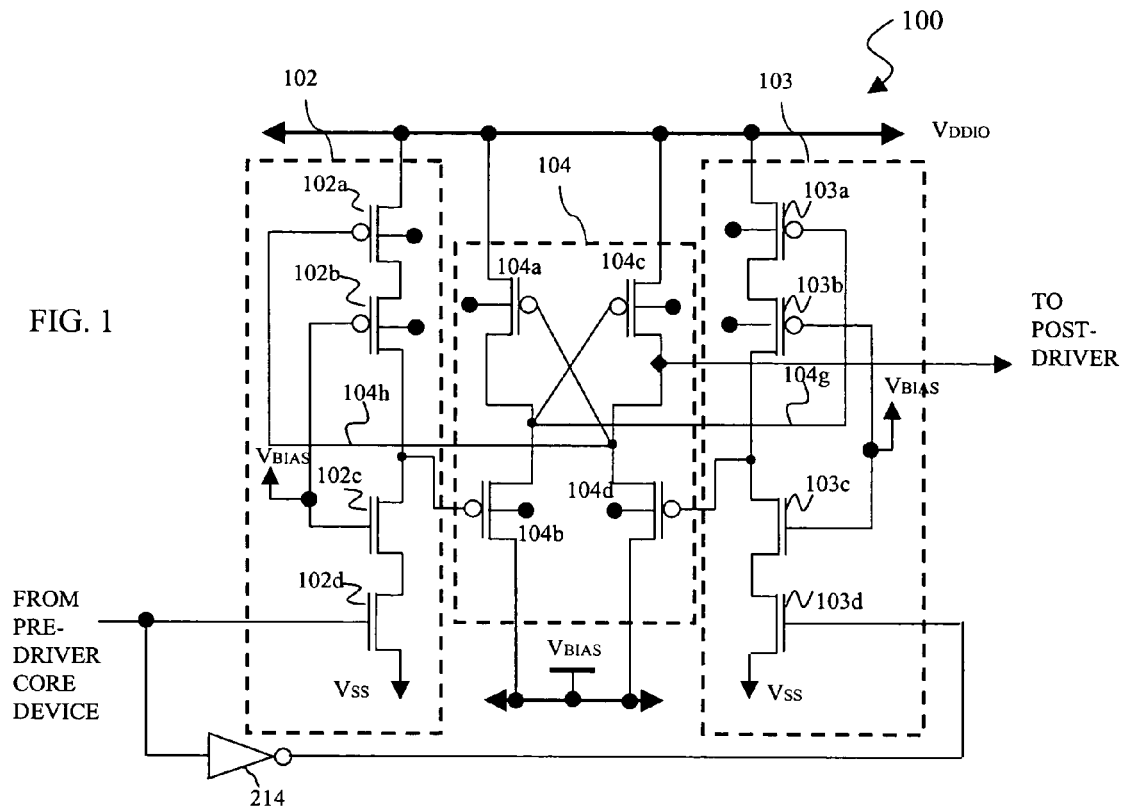
FIG. 1 is a schematic diagram of one embodiment of a level-up output circuit constructed according to aspects of the present disclosure.

The present disclosure relates generally to an integrated circuit device and method for fabrication, and more specifically to an integrated circuit with a cross-latched voltage level shifter. It is understood, however, that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

One solution to interface low voltage devices and common integrated devices is to provide voltage level shifters to adjust the voltage level of the input and output signals into and from these low voltage devices. However, these voltage level shifters have been implemented with special fabrication technologies and processes, thus adding to the manufacturing cost and time of these low voltage devices.

FIG. 1 is a schematic diagram of one embodiment of a step-up output circuit 100 constructed according to aspects of the present disclosure. The circuit 100 may be implemented in core logic device fabrication processes for dual supply voltage applications. The circuit 100 may be used to step up the voltage level of output signals from core supply voltage, $V_{DD}$, to input/output voltage, $V_{DDIO}$, and provided to the output pads. $V_{DDIO}$ is generally much higher than the core supply voltage, $V_{DD}$. For example, $V_{DDIO}$ voltage level may be 3.3 volts and $V_{DD}$ voltage level may be much lower than $V_{DDIO}$, such as at or below about 1.0 volts. In certain applications, $V_{DD}$ may be higher than 1.0 volts such as about 1.8 volts, for example.

The circuit 100 includes at least two cascode inverter amplifiers 102 and 103 coupled to an output stage 104. The amplifier 102 include a plurality of microelectronic devices 102a–d coupled in series between $V_{DDIO}$ and $V_{SS}$. $V_{SS}$ may be a biased supply voltage or ground. The devices 102a–b may comprise p-type transistors such as p-type metal oxide field effect transistors (PMOSFET or PMOS) and the devices 102c–d may comprise n-type metal oxide field effect transistors (NMOSFET or NMOS). The substrate of the p-type transistors 102a and 102b may be coupled to a floating well bias circuit 110 described in more detail below. The bulk of n-type devices 102c and 102d may be coupled to $V_{SS}$. The devices 102a–d each include a gate electrode, a source/drain region, and/or other features. The gate electrodes of the p-type device 102b and the n-type device 102c are coupled to the bias supply voltage, $V_{BIAS}$. The gate electrodes of the p-type device 102a is coupled to the output stage 104. The gate electrode of the n-type device 102d is coupled to a pre-driver core device (not shown) that provides the signal to be output to the output pad.

Figure 2:
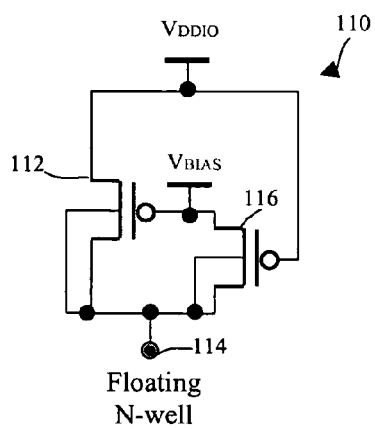
FIG. 2 is a schematic diagram of one embodiment of a floating well bias circuit constructed according to aspects of the present disclosure.

Similarly, The amplifier 103 comprises p-type devices and n-type devices 103a–d coupled in series between $V_{DDIO}$ and $V_{SS}$. The substrate of the p-type transistors 103a and 103b may be coupled to the floating well bias circuit 110 (FIG. 2). The bulk of n-type devices 103c and 103d may be coupled to $V_{SS}$. The devices 103a–d each include a gate electrode, a source/drain region, and/or other features. The gate electrodes of the p-type device 103b and the n-type device 103c are coupled to the bias supply voltage, $V_{BIAS}$. The gate electrodes of the p-type device 103a is coupled to the output stage 104. The gate electrode of the n-type device 102d is coupled to the output of an inverter 214, the input of which is coupled to the pre-driver core device (not shown) that provides the output signal for the output pad.

The output stage 104 comprises a p-type device 104a coupled in series with a second p-type device 104b between $V_{DDIO}$ and $V_{BIAS}$, and a second set of p-type devices 104c and 104d also coupled in series between $V_{DDIO}$ and $V_{BIAS}$. The two sets of devices are cross-coupled or cross-latched. The gate electrode of the device 104a is coupled to the drain of the device 104c, and the gate of device 104d is coupled to the drain of the device 104a. In addition, the drain of the device 104a is also coupled to the gate electrode of p-type device 102a, and the drain of the device 104c is coupled to a post-driver circuit 206 described in detail below with reference to FIG. 3. The substrates of the p-type devices 104a–d in the output stage 104 may be coupled to the floating well bias circuit 110 (FIG. 2).

Although the circuit 100 is an input/output circuit operable to step up the voltage level of an output signal from 0 volts to core supply voltage, $V_{DD}$, to $V_{BIAS}$ to input/output supply voltage, $V_{DDIO}$, it may be implemented using the same semiconductor fabrication technology as the core circuits. In other words, the circuit 100 may be implemented to have the same gate oxide thickness as the core circuits. Therefore, a single gate oxide fabrication process may be used if the difference between the two supply voltage ranges are very large. For example, single gate oxide technique may be used if the input/output supply voltage is less than twice the core supply voltage.

FIG. 2 is a schematic diagram of one embodiment of a floating well bias circuit 110 constructed according to aspects of the present disclosure. The bias circuit 110 comprises a first p-type transistor 112 coupled between the input/output voltage, $V_{DDIO}$, and a node 114 coupled to a floating n-well (not shown). The gate of transistor 112 is coupled to bias supply voltage, $V_{BIAS}$, which is also coupled to the source of a second p-type transistor 116. The gate of the transistor 116 is coupled to $V_{DDIO}$, and its drain is also coupled to the node 114. The substrate of both devices 112 and 116 are coupled to the floating n-well. The substrate of the p-type devices in the amplifiers 102 and 103 and the output stage 104 may be coupled to node 114.

Figure 3:
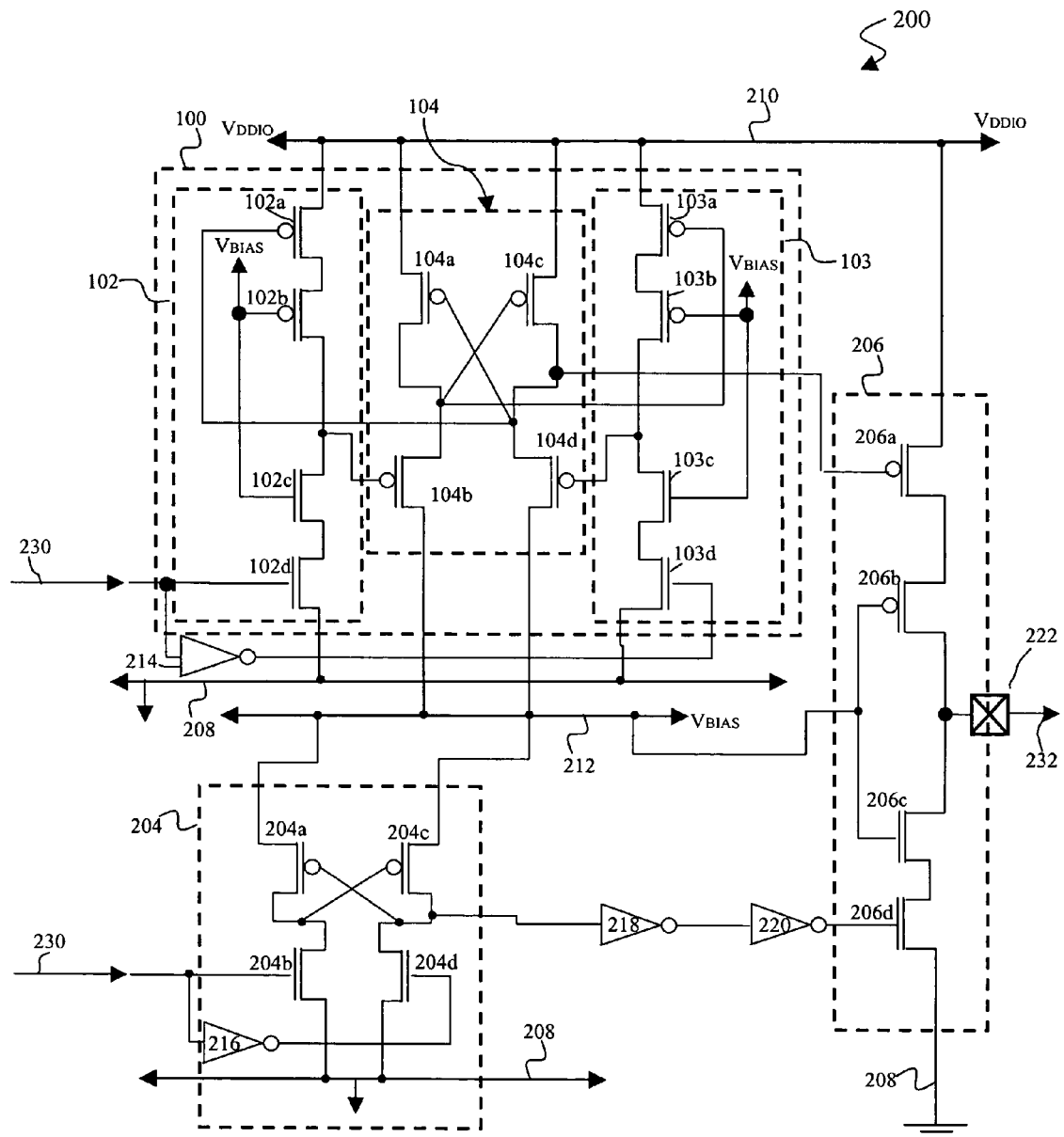
FIG. 3 is a more detailed schematic diagram of one embodiment of a level-up output circuit constructed according to aspects of the present disclosure.

FIG. 3 is a more detailed schematic diagram of one embodiment of a level-up output circuit 200 constructed according to aspects of the present disclosure. Circuit 200 comprises the circuit 100 described above and shown in FIG. 1 and additional circuitry. A post-driver circuit 206 comprises serially-coupled p-type transistors 206a and 206b, and n-type transistors 206c and 206d coupled in a cascode inverter configuration. The gate of p-type device 206a is coupled to the drain of p-type transistor 104c in the output stage circuit 104 to receive a first drive signal. The gate electrodes of the p-type device 206b and the n-type device 206c are coupled to $V_{BIAS}$. The gate of n-type device 206d is coupled to a level shift amplifier 204 via two serially-coupled inverters 218 and 220 and generating a second drive signal. A level-up output signal 232 is provided at a common node coupled to the drain of the p-type device 206d and the drain of the n-type device 206c.

The level shift amplifier 204 comprises a differential circuit with a p-type transistor 204a coupled in series with an n-type transistor 204b between $V_{BIAS}$ and $V_{SS}$. Circuit 204 further includes a second pair of serially-coupled p-type transistor 204c and n-type transistor 204d coupled between $V_{BIAS}$ and $V_{SS}$. The two sets of transistors are cross-coupled. The gate of the p-type transistor 204a is coupled to the drain of the p-type transistor 204c and the gate of the p-type transistor 204c is coupled to the drain of the p-type transistor 204a. The gate of the n-type transistor 204b is coupled to an input signal 230, which is also provided to the circuit 100. The gate of the n-type transistor 204d is coupled to the output of an inverter 216, the input of which is coupled to signal 230. An output at the drain of the p-type transistor 204c is coupled to the input of the inverter 218 that is coupled to the inverter 220 and to the circuit 206.

In operation, a signal 230 spanning a low voltage range, such as between about 0 volts and about $V_{DD}$, inclusively, received by the circuit 200 is shifted up to a higher range of voltage levels, such as between about $V_{BIAS}$ and about $V_{DDIO}$, inclusively. This circuit configuration makes it possible to be implemented with single gate oxide fabrication process. The circuit 200 may be implemented in core logic device fabrication processes for dual supply voltage applications.

Figure 4:
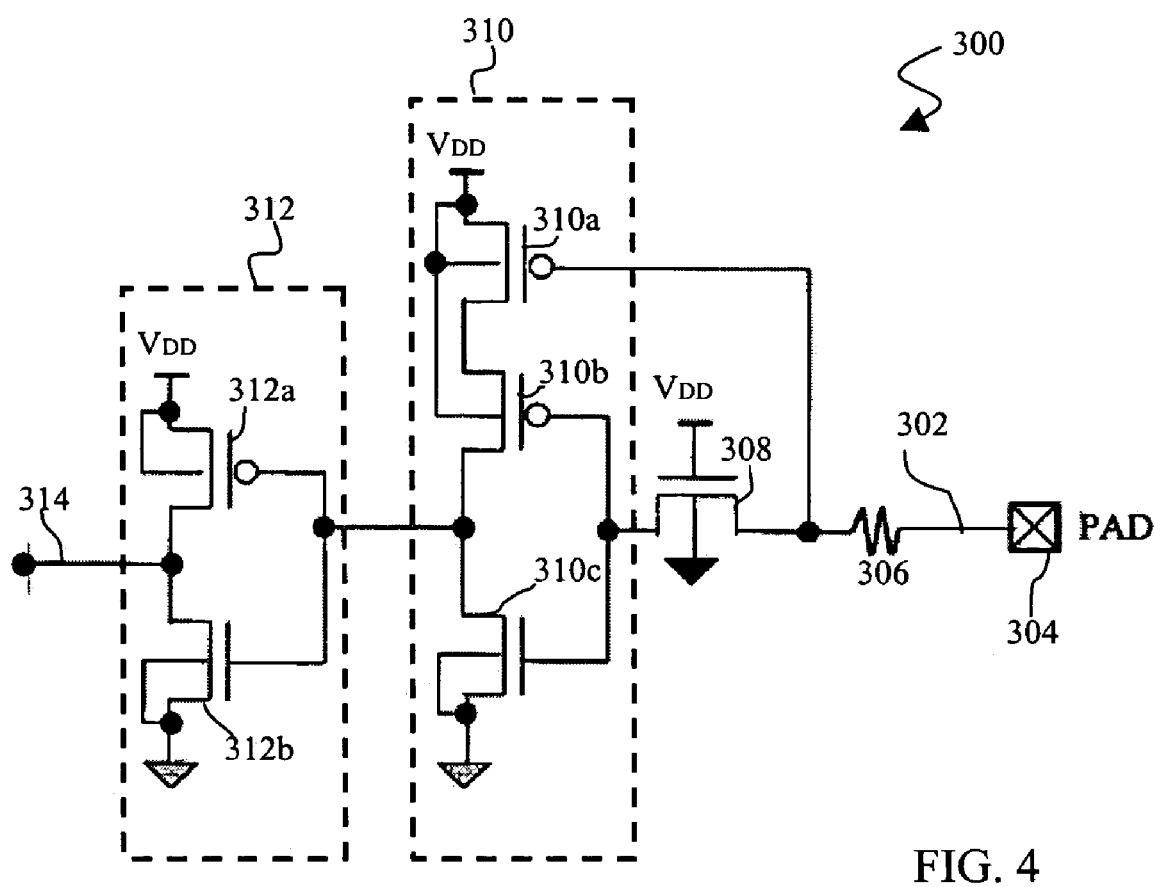
FIG. 4 is a schematic diagram of one embodiment of a level-down input circuit constructed according to aspects of the present disclosure.

FIG. 4 is a schematic diagram of one embodiment of a level-down input circuit 300 constructed according to aspects of the present disclosure. An input pad 304 is adapted to receive an input signal 302 in a range between about 0 volts to about $V_{DDIO}$. A resistor 306 is coupled to input pad 304 followed by a pass n-type transistor 308. The gate of the n-type pass transistor 308 is coupled to core supply voltage, $V_{DD}$. A circuit 310 is coupled to the pass transistor 308. The circuit 310 includes a p-type transistor 310a, a p-type transistor 310b, and an n-type transistor 310c coupled in series between $V_{DD}$ and $V_{SS}$. The gate of the p-type transistor 310a is coupled to a node between the resistor 306 and the pass transistor 308. The gate electrodes of the p-type transistor 310b and the n-type transistor 310c are coupled to the pass transistor 308. The common node between the drain of the p-type transistor 310b and the drain of the n-type transistor 310c is coupled to an input of an inverter 312. The inverter 312 comprises a p-type transistor 312a coupled in series with an n-type transistor 312b between $V_{DD}$ and $V_{SS}$. The output of the inverter 312 is a signal 314 that ranges between about 0 volts to about $V_{DD}$.

Figure 5:
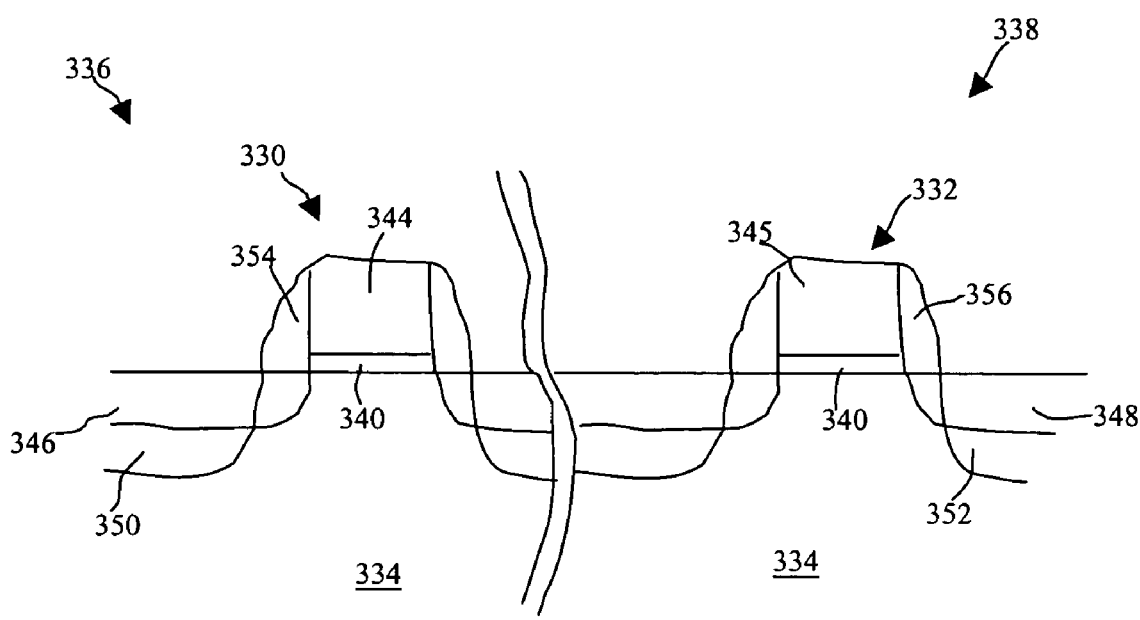
FIG. 5 is a sectional view of an embodiment of a transistor in the input/output circuit and of a transistor in a core device of an integrated circuit.

FIG. 5 is a sectional view of an embodiment of a transistor 330 in the input/output circuits and of a transistor 332 in a core device of an integrated circuit. The transistor 330 may be a p-type transistor or an n-type transistor in the level-up output circuit 100 and 200 or in the level-down input circuit 300 located in a region 336 designated for input/output devices and circuits. The transistor 332 may be a p-type or n-type transistor of core devices located in a second region 338 designated for core devices and circuits. The transistor 330 in the core circuit may be fabricated substantially simultaneously with the same technology as the transistor 332 in the input/output circuits. The transistors 330 and 332 are formed over a substrate 334 using technologies now known or to be developed. A gate dielectric layer 340 may be formed over the substrate 334 for both transistors. The gate dielectric layer 340 may be a silicon dioxide. The terms "gate dielectric" and "gate oxide" may be used interchangeably herein. The gate dielectric layer 340 for the transistors in both regions may be of the same thickness. Gate structures 344 and 345 are then formed for each transistor 330 and 332, respectively. The gate structures 344 may comprise a doped polysilicon layer and may be formed using technologies now known or to be developed. Both transistors 330 and 332 may comprise doped source and drain regions that may include lightly doped drain/source regions 346 and 348, respectively, and heavily doped source and drain regions 350 and 352, respectively. The formation of the source and drain regions may employ known or suitable ion implantation techniques and recipes. Spacers 354 and 356 may be employed in the transistors 330 and 332, respectively, for the formation of the heavily doped source and drain regions 350 and 352, respectively. It may be seen that the transistor 330 and other transistors in the input/output region 336 may have the same gate oxide thickness as the transistor 332 and other transistors in the core device region 338, and thereby obviating the need for additional fabrication process steps.

Figure 6:
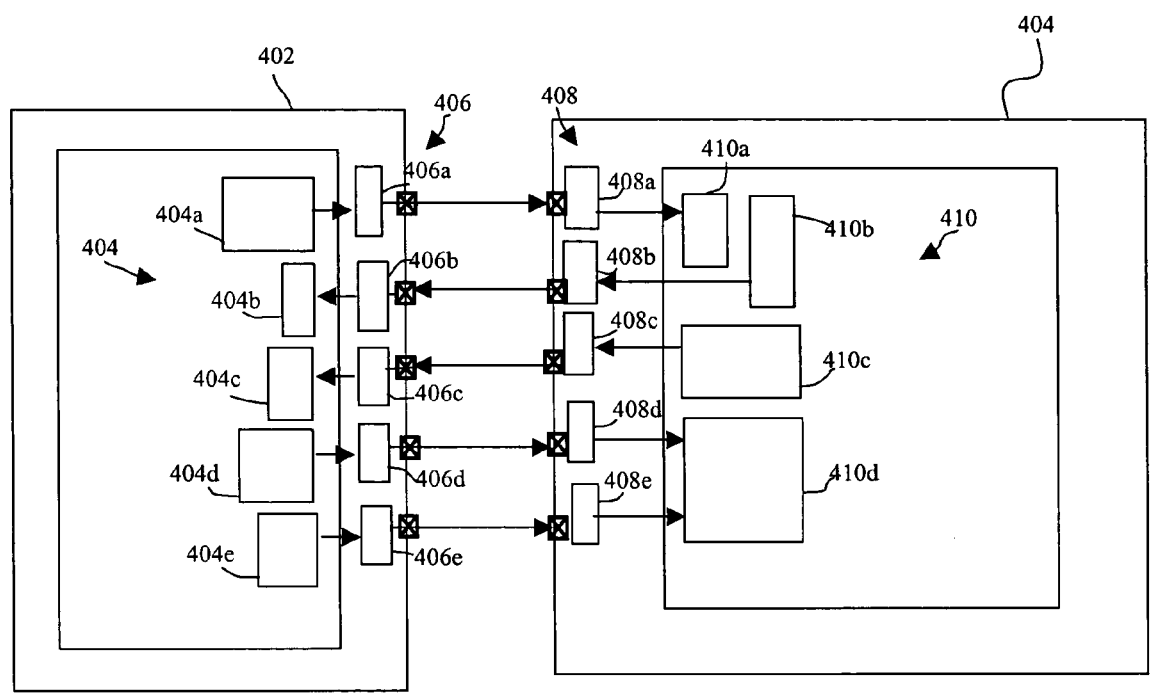
FIG. 6 is a simplified context block diagram according to aspects of the present disclosure.

FIG. 6 is a simplified context block diagram according to aspects of the present disclosure. An electronic circuit or system may comprise at least two integrated devices 402 and 404 coupled together. Each integrated circuit 402 and 404 comprise a plurality of semiconductor devices and features operating together to perform some function. In particular, the integrated circuit 402 comprises a plurality of core devices or circuits 404 that operate in the core supply voltage range, such as between 0 volts and about $V_{DD}$. Each core circuit 404a–e may be coupled to one or more input or output circuits 406 that are operable to level-shift up output signals destined to the output pads or to level-shift down input signal received at input pads. The input circuits 406b and 406c of the integrated circuit 402 may be implemented to incorporate the circuit 100 or the circuit 200 described above. The output circuits 406a, 406d and 406e of the integrated circuit 402 may be implemented to incorporate the circuit 300 described above. In this manner, the input and output circuits 406 may also operate in the core supply voltage range while interfacing with input and output signals that range between 0 volts and input/output voltage level, $V_{DDIO}$.

Similarly, the integrated circuit 404 comprises a plurality of core devices or circuits 410 that operate in the core supply voltage range, such as between 0 volts and about $V_{DD}$. Each core circuit 410a–d may be coupled to one or more input or output circuits 408 that are operable to level-shift up output signals destined to its output pads or to level-shift down input signal received at its input pads. The input circuits 408a, 408d, and 408e of the integrated circuit 404 may be implemented to incorporate the circuit 100 or the circuit 200 described above. The output circuits 408b and 408c of the integrated circuit 404 may be implemented to incorporate the circuit 300 described above. In this manner, the input and output circuits 408 may also operate in the core supply voltage range while interfacing with input and output signals that range between 0 volts and input/output voltage level, $V_{DDIO}$.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. An integrated circuit for level-shifting voltage signals comprising:
   an input/output pad; and
   an input/output circuit coupled to the output pad having a plurality of devices operating with a bias supply voltage operable to shift between a range of a core supply voltage to an input/output supply voltage that is higher than the core supply voltage, wherein the input/output circuit comprises:
   a first cascode inverter amplifier;
   a second cascode inverter amplifier coupled to the first cascode inverter amplifier; and
   an output stage coupled to both the first and second cascode inverter amplifiers, the output stage comprising first and second transistors serially-coupled between the input/output supply voltage and the bias supply voltage cross-coupled with third and fourth transistors serially-coupled between the input/output supply voltage and the bias supply voltage.

2. The integrated circuit, as set forth in claim 1, further comprising:
   the output stage operable to generate a first drive signal;
   a level shifter coupled to the bias supply voltage and generating a second drive signal in response to receiving an output signal; and
   a post-driver circuit coupled to the input/output circuit and receiving the first drive signal and to the level shifter and receiving the second drive signal, and generating a level-up output signal.

3. An integrated circuit for level-shifting voltage signals comprising:
   an input/output pad; and
   an input/output circuit coupled to the output pad having a plurality of devices operating with a bias supply voltage operable to shift between a range of a core supply voltage to an input/output supply voltage that is higher than the core supply voltage, wherein the input/output circuit comprises:
   a first cascode inverter amplifier;
   a second cascode inverter amplifier coupled to the first cascode inverter amplifier; and
   an output stage coupled to both the first and second cascode inverter amplifiers, the output stage comprising first and second transistors serially-coupled between the input/output supply voltage and the bias supply voltage cross-coupled with third and fourth transistors serially-coupled between the input/output supply voltage and the bias supply voltage, wherein the first cascode inverter amplifier comprises:
   first and second p-type transistors coupled in series, and wherein the second cascode inverter amplifier comprises
   first and second n-type transistors coupled in series and serially-coupled to the first and second p-type transistors and wherein
   a gate of the first p-type transistor is coupled to a node between the third and fourth serially-coupled transistors in the output stage and a gate of the first transistor in the output stage,
   a gate of the second n-type transistor is coupled to an output signal, and
   a gate of the second p-type transistor and the first n-type transistor are coupled to the bias supply voltage.

4. The integrated circuit, as set forth in claim 3, wherein the second cascode inverter amplifier comprises an amplification stage, comprising:
   first and second p-type transistors coupled in series;
   first and second n-type transistors coupled in series and serially-coupled to the first and second p-type transistors;
   a gate of the first p-type transistor coupled to a node between the first and second serially-coupled transistors in the output stage and a gate of the third transistor in the output stage;
   a gate of the second n-type transistor coupled to an inverse of an output signal; and
   a gate of the second p-type transistor and the first n-type transistor are coupled to the bias supply voltage.

5. An integrated circuit comprising:
   a first cascode inverter amplifier;
   a second cascode inverter amplifier coupled to the first cascode inverter amplifier; and
   an output stage coupled to both the first and second cascode inverter amplifiers, the output stage comprising first and second transistors serially-coupled between an input/output supply voltage and a bias supply voltage cross-coupled with third and fourth transistors serially-coupled between the input/output supply voltage and the bias supply voltage.

6. An integrated circuit comprising:
a first cascode inverter amplifier;
a second cascode inverter amplifier coupled to the first cascode inverter amplifier; and
an output stage coupled to both the first and second cascode inverter amplifiers, the output stage comprising first and second transistors serially-coupled between an input/output supply voltage and a bias supply voltage cross-coupled with third and fourth transistors serially-coupled between the input/output supply voltage and the bias supply voltage, wherein the first cascode inverter amplifier and the second cascode inverter amplifier comprise an amplifier stage, comprising:
first and second p-type transistors coupled in series;
first and second n-type transistors coupled in series and serially-coupled to the first and second p-type transistors;
a gate of the first p-type transistor coupled to a node between the third and fourth serially-coupled transistors in the output stage and a gate of the first transistor in the output stage;
a gate of the second n-type transistor is coupled to an output signal; and
a gate of the second p-type transistor and the first n-type transistor are coupled to the bias supply voltage.

7. The integrated circuit, as set forth in claim 6, further comprising:
the output stage operable to generate a first drive signal;
a level shifter coupled to the bias supply voltage and generating a second drive signal in response to receiving an output signal; and
a post-driver circuit coupled to the input/output circuit and receiving the first drive signal and to the level shifter and receiving the second drive signal, and generating a level-up output signal.

8. The integrated circuit, as set forth in claim 5, comprising:
an input/output region comprising input/output circuits; a core circuit region proximate to the input/output region comprising core circuits coupled to the input/output circuits having a gate dielectric thickness substantially similar to a gate dielectric thickness of the input/output circuits.

9. An integrated circuit, comprising:
an input circuit coupled to an input pad operable to input shift signals from an input/output supply voltage range to a core supply voltage range;
an output circuit coupled to an output pad operable to shift output signals from a bias supply voltage range to an input/output supply voltage range; and
a core circuit coupled to the input and output circuits and having a gate dielectric thickness substantially similar to a gate dielectric thickness of the input circuit and the output circuit, wherein the output circuit comprises:
a first cascode inverter amplifier;
a second cascode inverter amplifier coupled to the first cascode inverter amplifier;
an output stage coupled to both the first and second cascode inverter amplifiers, the output stage comprising first and second transistors serially-coupled between the input/output supply voltage and the bias supply voltage cross-coupled with third and fourth transistors serially-coupled between the input/output supply voltage and the bias supply voltage, wherein the first cascode inverter amplifier is included in an amplifier stage, comprising:
first and second p-type transistors coupled in series;
first and second n-type transistors coupled in series and serially-coupled to the first and second p-type transistors;
a gate of the first p-type transistor coupled to a node between the third and fourth serially-coupled transistors in the output stage and a gate of the first transistor in the output stage;
a gate of the second n-type transistor coupled to an output signal;
a gate of the second p-type transistor and the first n-type transistor coupled to the bias supply voltage.

10. The integrated circuit, as set forth in claim 9, wherein the second cascode inverter amplifier is included in an amplifier stage, comprising:
first and second p-type transistors coupled in series;
first and second n-type transistors coupled in series and serially-coupled to the first and second p-type transistors;
a gate of the first p-type transistor coupled to a node between the first and second serially-coupled transistors in the output stage and a gate of the third transistor in the output stage;
a gate of the second n-type transistor is coupled to an inverse of an output signal;
a gate of the second p-type transistor and the first n-type transistor are coupled to the bias supply voltage.

11. An integrated circuit, comprising:
an input circuit coupled to an input pad operable to input shift signals from an input/output supply voltage range to a core supply voltage range;
an output circuit coupled to an output pad operable to shift output signals from a bias supply voltage range to an input/output supply voltage range; and
a core circuit coupled to the input and output circuits and having a gate dielectric thickness substantially similar to a gate dielectric thickness of the input circuit and the output circuit, wherein the output circuit comprises:
a first cascode inverter amplifier;
a second cascode inverter amplifier coupled to the first cascode inverter amplifier;
an output stage coupled to both the first and second cascode inverter amplifiers, the output stage comprising first and second transistors serially-coupled between the input/output supply voltage and the bias supply voltage cross-coupled with third and fourth transistors serially-coupled between the input/output supply voltage and the bias supply voltage.

12. The integrated circuit, as set forth in claim 11, wherein the input/output supply voltage is no more than twice the bias supply voltage.

13. The integrated circuit, as set forth in claim 11, further comprising:
the output stage operable to generate a first drive signal;
a level shifter coupled to the bias supply voltage and generating a second drive signal in response to receiving an output signal;
a post-driver circuit coupled to the input/output circuit and receiving the first drive signal and to the level shifter and receiving the second drive signal, and generating a level-up output signal.

14. The integrated circuit, as set forth in claim 11, wherein the input/output supply voltage ranges about 0 volts to about 1.8 volts, and the core supply voltage ranges about 0 volts to about 1.0 volts.

* * * * *